US011243245B2

(12) United States Patent
Su

(10) Patent No.: US 11,243,245 B2
(45) Date of Patent: Feb. 8, 2022

(54) ANALYSIS METHOD FOR SEMICONDUCTOR DEVICE

(71) Applicant: Shanghai Huali Integrated Circuit Mfg. Co., Ltd., Shanghai (CN)

(72) Inventor: Ping-Hsun Su, Shanghai (CN)

(73) Assignee: Shanghai Huali Integrated Circuit Mfg. Co. Ltd., Shanghai (CN)

( * ) Notice: Subject to any disclaimer, the term of this patent is extended or adjusted under 35 U.S.C. 154(b) by 58 days.

(21) Appl. No.: 16/829,026

(22) Filed: Mar. 25, 2020

(65) Prior Publication Data
US 2020/0309843 A1 Oct. 1, 2020

(30) Foreign Application Priority Data

Mar. 29, 2019 (CN) .......................... 201910250826.6

(51) Int. Cl.
*G01R 31/26* (2020.01)
*H01L 21/66* (2006.01)
*G06F 17/40* (2006.01)

(52) U.S. Cl.
CPC ......... *G01R 31/2621* (2013.01); *G06F 17/40* (2013.01); *H01L 22/12* (2013.01)

(58) Field of Classification Search
CPC ....... H01L 21/00; H01L 2221/00; G11C 5/00; G11C 2207/00; G01B 1/00; G01B 2210/00; G01N 1/00; G01N 2201/00; G01R 1/00
See application file for complete search history.

(56) References Cited

U.S. PATENT DOCUMENTS

| | | | |
|---|---|---|---|
| 2009/0276174 A1* | 11/2009 | Good ............... | G05B 19/41875 702/81 |
| 2011/0093226 A1* | 4/2011 | Chieh-Chu ...... | G05B 19/41875 702/82 |
| 2012/0102443 A1* | 4/2012 | Liu .......................... | G06F 30/34 716/106 |

(Continued)

*Primary Examiner* — Jermele M Hollington
*Assistant Examiner* — Temilade S Rhodes-Vivour
(74) *Attorney, Agent, or Firm* — Adsero IP

(57) ABSTRACT

The present disclosure provides an analysis method of a semiconductor device, and the semiconductor device comprises a plurality of HKMG fin field effect transistors and a wafer on which the plurality of HKMG fin field effect transistors are located, and the analysis method comprises: performing acceptance testing on the wafer to be tested; constructing an N-type model based on the position of each N-type transistor at the surface of the wafer to be tested and the corresponding acceptance test result, constructing a P-type model based on the position of each P-type transistor at the surface of the wafer to be tested and the corresponding acceptance test result, and constructing an N/P ratio model corresponding to the surface of the wafer to be tested based on the N-type model and the P-type model; and identifying the N/P ratio model based on a preset standard wafer model to determine whether the wafer to be tested is compliant based on the N/P ratio model. According to the analysis method provided by the present disclosure, it is possible to find a non-compliant wafer among a plurality of wafers, thereby enabling the subsequent targeted parameter analysis and improving the efficiency of optimizing the process scheme.

12 Claims, 4 Drawing Sheets

(56) References Cited

U.S. PATENT DOCUMENTS

| | | | | |
|---|---|---|---|---|
| 2012/0235702 A1* | 9/2012 | Huang | ............... | G11C 16/0425 324/762.01 |
| 2015/0308969 A1* | 10/2015 | Pois | ................... | G01N 23/2273 378/46 |
| 2016/0163574 A1* | 6/2016 | Chang | .............. | G05B 19/41875 702/81 |

* cited by examiner

ANALYSIS METHOD FOR SEMICONDUCTOR DEVICE

CROSS-REFERENCES TO RELATED APPLICATIONS

The present application claims priority to Chinese Patent Application No. 201910250826.6, filed on Mar. 29, 2019, entitled "Analysis method for semiconductor device", which is incorporated by reference herein for all purposes.

FIELD

The present disclosure relates to the field of semiconductors, and more particularly to the analysis and optimization of on-line process parameters for the manufacture of semiconductor devices.

BACKGROUND

The introduction of FinFET (Fin-Field Effect Transistor) is a major advancement in the semiconductor industry of the 16 nm technology generation. Although the 16-nm high dielectric material metal gate fin field effect transistor (HKMG FinFET, High-K Metal Gate FinFET) is being introduced into mass production, there is still much room for improvement in process optimization, for example, variations in transistor electrical characteristics caused by process variations, and the effects of process variations on components and circuits caused by the latest 3D structures and new processes in the manufacturer.

Although, in terms of theoretical research, there are already related literatures discussing the optimization of the above process, most of the existing related literatures use computer simulation to simulate the variation of process and component electrical characteristics. Moreover, only a few known process steps have been discussed, and all process steps have not been integrated into a comprehensive analysis, the interaction effects of the processes and the interaction between processes and transistor's electrical characteristics have not been studied. Therefore, there is no corresponding solution for optimizing the process.

What is even more difficult is that there are too many process variation parameters in the advanced process, and a large amount of data, especially a large amount of data having an influence relationship with each other, is difficult for the technicians in the field to handle the analysis work.

Therefore, it is desirable to provide an analysis method to accurately and quickly finding a problematic non-compliant wafer from a plurality of wafers, thereby providing a possibility for subsequently researching on the relevant parameters of the non-compliant wafer and optimizing the process scheme.

SUMMARY

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

In order to make up for the fact that there is no way in the industry to quickly and accurately find data with targeted research significance in numerous intricate data, thereby improving the efficiency of manufacturing HKMG fin field effect transistor process schemes, the present disclosure provides an analysis method of a semiconductor device, and the semiconductor device comprises a plurality of HKMG fin field effect transistors and a wafer on which the plurality of HKMG fin field effect transistors are located, and the analysis method comprises:

performing acceptance testing on the wafer to be tested;

constructing an N-type model based on the position of each N-type transistor at the surface of the wafer to be tested and the corresponding acceptance test result, constructing a P-type model based on the position of each P-type transistor at the surface of the wafer to be tested and the corresponding acceptance test result, and constructing an N/P ratio model corresponding to the surface of the wafer to be tested based on the N-type model and the P-type model; and identifying the N/P ratio model based on a preset standard wafer model to determine whether the wafer to be tested is compliant based on the N/P ratio model.

In an embodiment of the foregoing analysis method, the analysis method further comprises:

performing clustering processing on the N/P ratio model, and the clustered N/P ratio model displays a distribution of N/P ratio groups on the surface of the wafer to be tested;

the identifying further includes: comparing a similarity between the standard wafer model and the clustered N/P ratio model; and the standard wafer model shows a distribution of the optimal N/P ratio group on the wafer surface; and in response to the similarity being lower than a preset threshold, the wafer to be tested corresponding to the N/P ratio model is not compliant.

In an embodiment of the foregoing analysis method, the N/P ratio model is clustered by a k-means clustering method.

In an embodiment of the foregoing analysis method, the analysis method further comprises:

obtaining an acceptance test result of the transistor corresponding to the standard wafer model;

calculating a ratio of an acceptance test result of the N-type transistor corresponding to the standard wafer model to an acceptance test result of the P-type transistor as an N/P standard coefficient;

constructing an electrical characteristic curve of the transistor corresponding to the standard wafer model based on the acceptance test result of the transistor corresponding to the standard wafer model and the N/P standard coefficient, and determining an N/P optimum coefficient based on the electrical characteristic curve.

In an embodiment of the foregoing analysis method, the constructing the N/P ratio model further comprises: corresponding to the surface of the wafer to be tested, calculating the ratio of an acceptance test result of the N-type transistor and an acceptance test result of P-type transistor as an N/P test coefficient; and the analyzing method further includes: comparing whether a difference between the N/P test coefficient and the N/P optimal coefficient is less than a pre-set threshold to determine whether the wafer to be tested is compliant.

In an embodiment of the foregoing analysis method, the acceptance test comprises at least: testing one or more of the turn-on voltage, the puncture voltage, the saturation current, the quiescent current, the turn-off current, the frequency of the N-type semiconductor, the P-type semiconductor.

In an embodiment of the foregoing analysis method, the analyzing method further comprises: for the wafer to be tested that is determined to be non-compliant, obtaining process parameters for manufacturing the non-compliant wafer to be tested; and analyzing the process parameters based on an expert system.

In an embodiment of the foregoing analysis method, the analysis method further comprises: optimizing the process parameters based on the analyzed result.

The present disclosure also provides a computer apparatus comprising a memory, a processor and a computer program stored on the memory and operable on the processor, and the processor executes the computer program to perform the steps of the analysis method according to any one of the foregoing analysis methods.

The present disclosure also provides a computer readable storage medium having stored there on a computer program, and the computer program is executed by a processor to perform the steps of the analysis method according to any one of the foregoing analysis methods.

According to the analysis method provided by the present disclosure, the wafer surface to be tested is modeled based on the acceptance test result of the wafer to be tested of the HKMG fin field effect transistor, and further, by constructing three models that are an N-type model, a P-type model and an N/P ratio model, especially comparing the established N/P ratio model with the pre-set standard model, the problematic non-compliant wafer can be found quickly and accurately in many wafers. Therefore, it is possible to further develop the relevant parameters of the non-compliant wafer, thereby optimizing the process parameters, and improving the efficiency of providing such possibility.

REFERENCE SIGNS

Z-C central zone
Z-E edge zone
Z-M middle zone

DETAILED DESCRIPTION

The disclosure is described in detail below with reference to the drawings and specific embodiments. It is to be noted that the aspects described below in conjunction with the drawings and the specific embodiments are merely exemplary and are not to be construed as limiting the scope of the disclosure.

In the following detailed description, numerous specific details are set forth to provide a more thorough understanding of the present disclosure. However, embodiments of the present disclosure may be practiced without limitations from these specific details. In other words, well-known structures and devices are shown in a block diagram form and are not shown in detail, to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Figure 1:
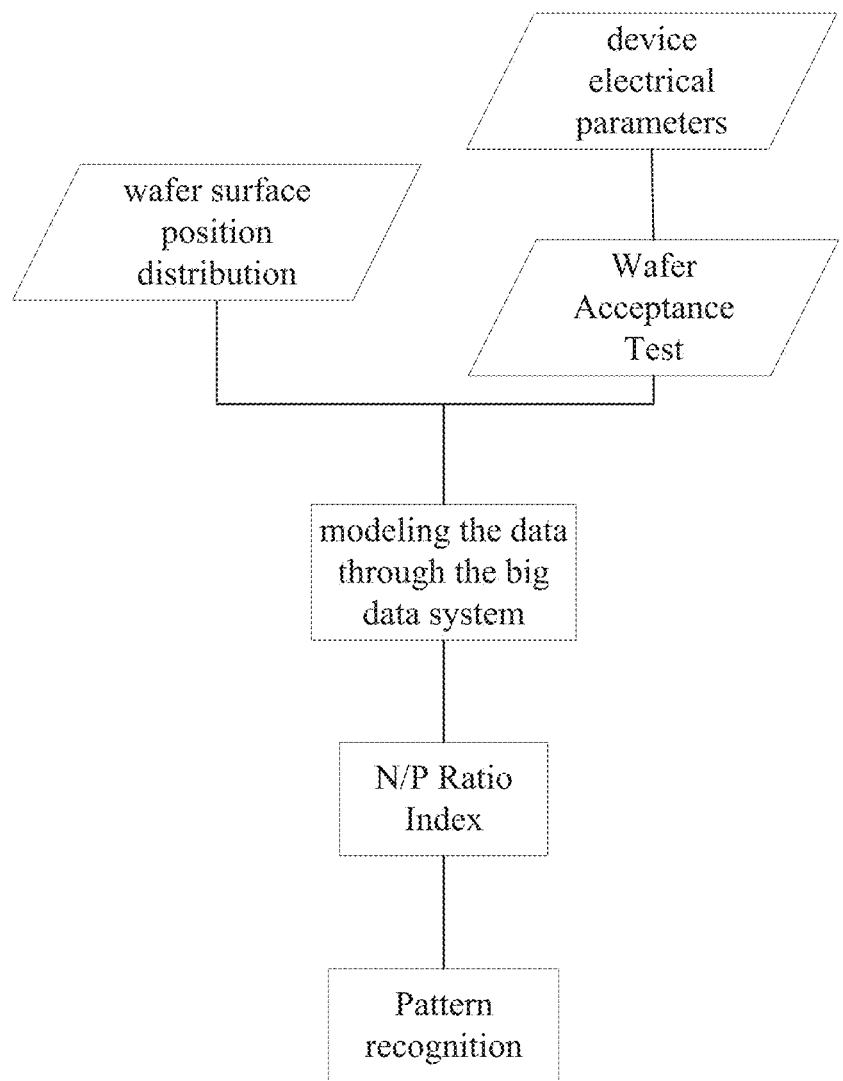
FIG. 1 shows a flow chart of the analysis method provided by the present disclosure.

As described above, the present disclosure provides an analysis method of a semiconductor device for analyzing a plurality of HKMG fin field effect transistors and their wafers. Referring to FIG. 1, FIG. 1 shows a flow of an analysis method provided by the present disclosure. The analysis method provided by the present disclosure specifically includes, in step 1, defining the device electrical parameters of the HKMG Fin Field Effect Transistor, and obtain the specific values of the electrical parameters through the WAT (Wafer Acceptance Test). Wafer acceptance test is in a special position in the semiconductor production enterprise's processing line. Off-line WAT testing is performed after all processing steps being performed, and all wafers must undergo WAT testing to determine if the wafer meets the expected specifications. The data tested by WAT has many engineering applications, including: testing process window, testing design rules, controlling process parameters, debugging the process, characterizing reliability, modeling the device design and developing next-generation products and more.

Typically, off-line WAT tests wafers after the wafer has completed the manufacturing process. With the development of technology, some products have a very long manufacturing cycle of up to three months. In this case, if there is a problem with the process at the previous station, the problem is discovered when the WAT is reached, which affects a large number of products and causes significant losses to the manufacturing company. Therefore, it is necessary to find out problems as early as possible.

In order to solve the above problem, an online WAT test can also be used to solve such a problem. The so-called online test is opposite to the offline test. The wafer where the semiconductor device is located is tested offline after the completion of the test. After the test, the wafer will not return to the process line to continue the next manufacturing process. After the online test, the wafer needs to continue to the next site for manufacturing processes. In one embodiment, the WAT system used in the present disclosure is configured in an online WAT.

Further, the test parameters of the WAT are divided into two categories, one is related to the device, including the turn-on voltage, the saturation current, the turn-off current, the puncture voltage, and the like of the MOS transistor. The other type is structurally related, including sheet resistance, contact resistance, gate oxide thickness, isolation, and the like.

In the present disclosure, the test parameters of the WAT are more focused on the above-described turn-on voltage, puncture voltage, saturation current, quiescent current, turn-off current, frequency and the like, which are related to the electrical characteristics of the device. After the WAT test, specific values of the device-related electrical characteristic parameters can be obtained.

It should be noted that although the WAT test is introduced by way of example, the relevant parameters of the above electrical characteristics of the device can also be implemented by other existing or future test methods and test means, and are not limited to the above WAT test.

Step 1 further includes obtaining a wafer surface position distribution so the device electrical parameters can be correlated with the wafer surface position distribution.

After obtaining the wafer surface position distribution and the electrical parameters of the HKMG fin field effect transistors on the wafer, step 2 is performed to put the above data into the big data system modeling. Constructing the models comprises: constructing an N-type model based on the position of each N-type transistor at the surface of the wafer to be tested and the corresponding acceptance test result, constructing a P-type model based on the position of each P-type transistor at the surface of the wafer to be tested and the corresponding acceptance test result, and constructing an N/P ratio model corresponding to the surface of the wafer to be tested based on the N-type model and the P-type model.

Figure 2:
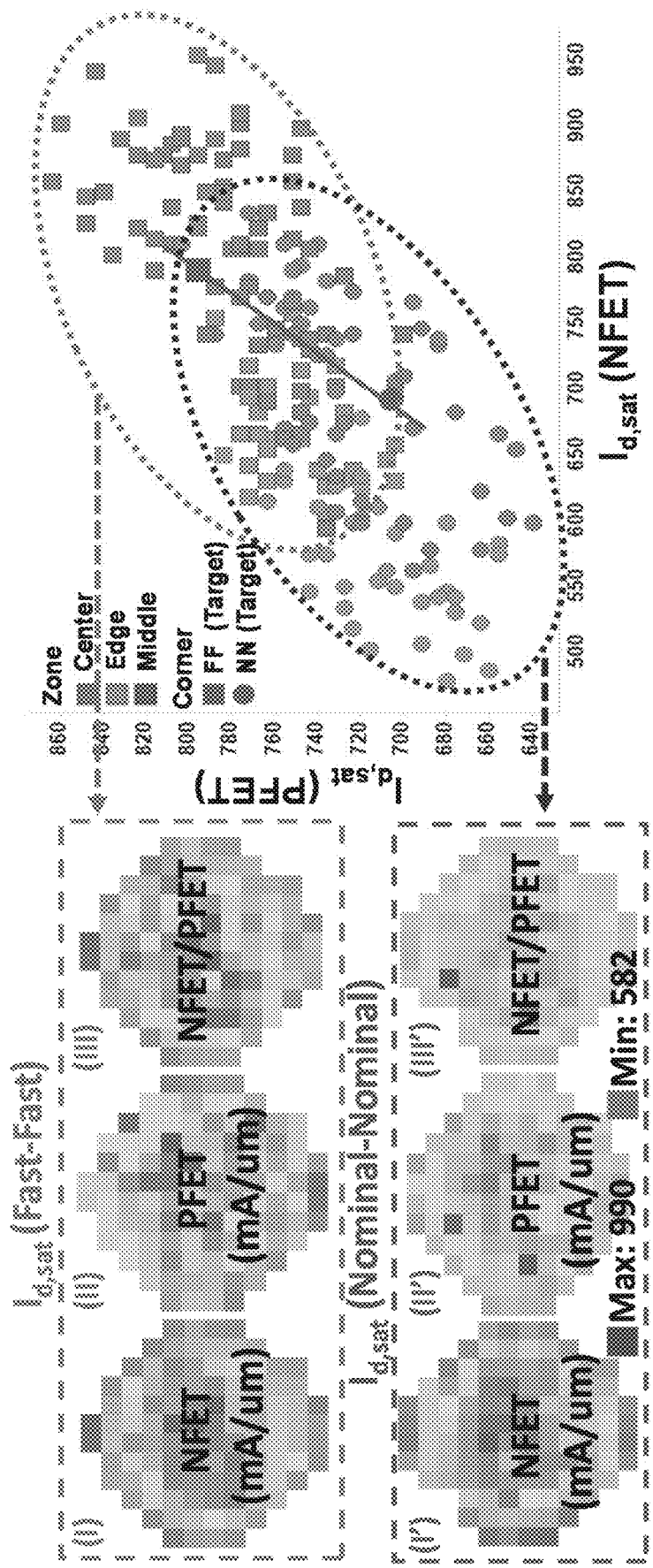
FIG. 2 is a schematic diagram showing a model constructed by the analysis method provided by the present disclosure.

Please refer to FIG. 2 to help understand the processing of the analysis method provided by the present disclosure in the modeling of the big data system and the constructed models.

FIG. 2 shows the saturation current properties of a HKMG fin field effect transistor. Specifically, testing the saturation current of the HKMG fin field effect transistor further includes testing the saturation current of the transistor at a normal performance N-N (Nominal-Nominal) and at a fast performance F-F (Fast-Fast).

The right part of FIG. 2 characterizes that in a big data system, the saturation current characteristic is first associated with the location of the transistor. In the right part of FIG. 2, the circular icon indicates the normal performance N-N (Nominal-Nominal), and the square icon indicates fast performance F-F (Fast-Fast), and the color (grayscale) of each icon characterizes its central zone (ZC), edge zone (ZE), and middle zone (ZM) on the wafer surface.

Further, the NFET model (corresponding to I, I'), the PFET model (corresponding to II, II') and N/P ratio model (corresponding to III, III') as shown in the left part of FIG. 2 can be constructed by the big data system modeling and the N/P ratio processing in step 3. No matter it is normal performance N-N or fast performance F-F, it can be seen from FIG. 2 that most of the transistors on the central zone have a high NFET saturation current, some of the transistors on the central zone have a high PFET saturation current, most of the transistors on the central zone have a higher N/P ratio, than the middle and edge zones.

After modeling by the big data system, step 4 can be performed to identify the established N/P ratio model to determine whether the wafer to be tested is compliant.

Further, the identifying further comprises comparing the N/P ratio model with the standard wafer model, calculating the similarity between the two to determine whether the distribution on the wafer of the N/P ratio of the wafer to be tested is same with the distribution on the wafer of the N/P ratios of the standard wafer model.

Figure 3A:
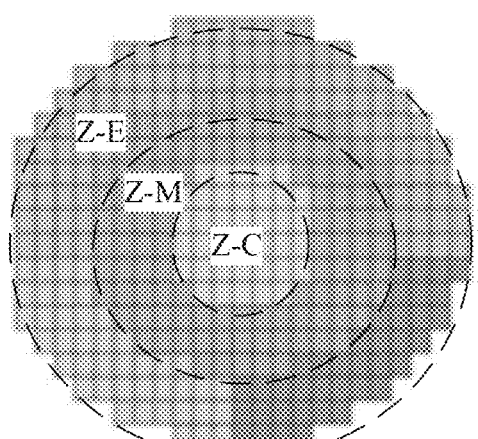
FIG. 3A is a schematic diagram showing a standard model preset by the analysis method provided by the present disclosure.

Specifically, please refer to FIG. 3A, which shows a schematic diagram of a standard wafer model showing the distribution of the expected optimal N/P ratios on the wafer. It is desirable to accumulate the relatively close N/P ratios in the central zone Z-C, the relatively close N/P ratios in the middle zone Z-M, and the relatively close N/P ratios in the edge zone Z-E.

Comparing the N/P model shown in FIG. 2 with the standard model shown in FIG. 3A, it can be seen that the model shown in FIG. 2 is close to the standard model in FIG. 3A, and thus the similarity is high, that is, the wafer to be tested shown in FIG. 2 is a compliant wafer.

Figure 3B:
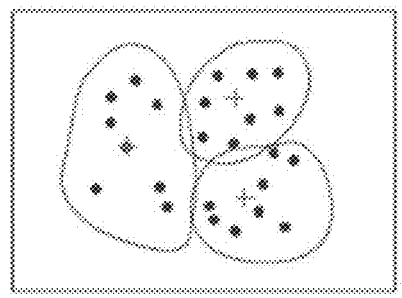
FIG. 3B is a schematic diagram showing an embodiment of a non-compliant wafer obtained by an analysis method provided by the present disclosure.
Figure 3C:
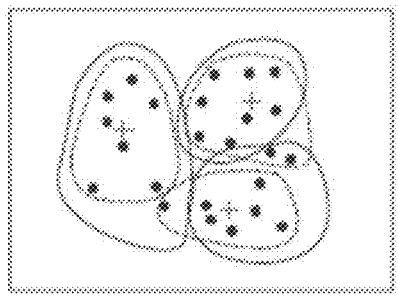
FIG. 3C is a schematic diagram showing another embodiment of a non-compliant wafer obtained by an analysis method provided by the present disclosure.
Figure 3D:
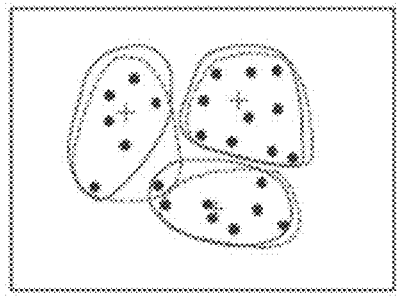
FIG. 3D is a schematic diagram showing another embodiment of a non-compliant wafer obtained by an analysis method provided by the present disclosure.

The step of identifying may further comprise clustering the N/P ratios distributed on the surface of the wafer, and comparing with the standard models according to the model after clustering. FIGS. 3B-3D show the distribution of N/P ratios obtained after clustering the N/P ratios of the wafer surface. It can be seen that the N/P ratio distribution shown in FIGS. 3B-3D is far from the standard model shown in FIG. 3A, that is, the similarity is low, and therefore, the wafer corresponding to these N/P ratio models are considered not compliant.

In some embodiments, the wafer to be tested can be determined by calculating the similarity between the standard wafer model and the clustered N/P ratio model, and determining the relationship between the similarity and the pre-set threshold. It can be understood that the preset threshold may be determined as needed according to actual conditions, and is not limited herein.

In an embodiment, the clustering method uses the K-means clustering method to cluster the N/P ratio model. First, clustering is a process of categorizing and organizing data members that are similar in some aspects. Clustering is a technique for discovering this internal structure. Clustering technology is often called unsupervised learning. Among them, k-means clustering is the most famous partitioning clustering algorithm, which makes it the most widely used of all clustering algorithms due to its simplicity and efficiency. The K-means clustering algorithm first randomly selects K objects as the initial clustering centers. The distance between each object and each seed cluster center is then calculated, and each object is assigned to the cluster center closest to it. The cluster center and the objects assigned to it represent a cluster. Once all objects have been assigned, the cluster center of each cluster is recalculated based on the existing objects in the cluster. This process will continue to repeat until a termination condition is met. The termination condition may be that no (or a minimum number of) objects are reassigned to different clusters, no (or a minimum number of) cluster centers are re-changed, the square sum of error is minimum.

In another aspect of the analysis method provided by the present disclosure, the step of performing the N/P ratio processing in the step 3 further comprises: obtaining an acceptance test result of the transistor corresponding to the standard wafer model; calculating a ratio of an acceptance test result of the N-type transistor corresponding to the standard wafer model to an acceptance test result of the P-type transistor as an N/P standard coefficient; constructing an electrical characteristic curve of the transistor corresponding to the standard wafer model based on the acceptance test result of the transistor corresponding to the standard wafer model and the N/P standard coefficient, and determining an N/P optimum coefficient based on the electrical characteristic curve.

Figure 4:
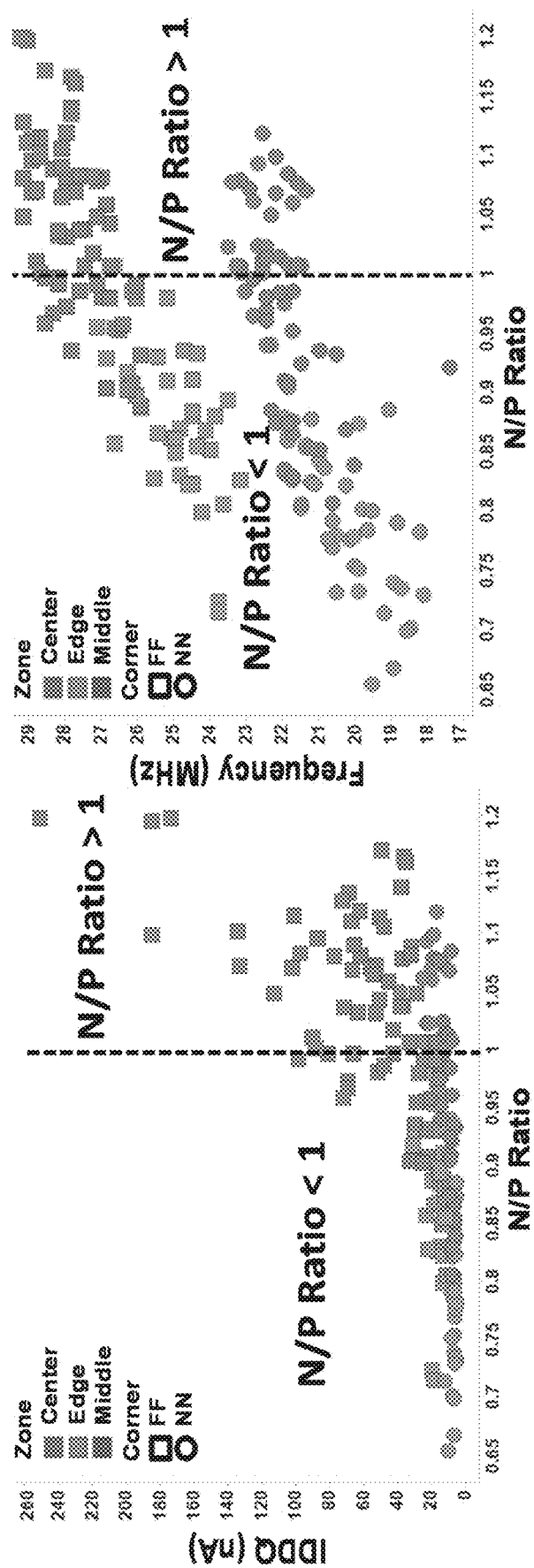
FIG. 4 is a schematic diagram showing the analysis method provided by the present disclosure for obtaining optimal N/P ratios.

Please refer to FIG. 4. FIG. 4 is a schematic diagram showing the optimal N/P ratio obtained by the analysis method provided by the present disclosure. The acceptance test results can be obtained according to the compliant standard wafer, then the N/P standard coefficients are calculated, and electrical characteristic curve of N/P standard coefficients and corresponding electrical properties is constructed. FIG. 4 shows two established electrical characteristic curves, namely the quiescent current $I_{DDQ}$ and the frequency with respect to the N/P ratio. As can be seen from FIG. 4, the quiescent current $I_{DDQ}$ does not rise substantially, or rises slowly when the N/P ratio is less than 1, and when the N/P ratio is greater than 1, the quiescent current $I_{DDQ}$ is too discrete (floating), therefore, the optimum N/P ratio for achieving the optimal electrical characteristics of the transistor can be determined to be 1 from the electrical characteristic curve.

Similarly, the frequency of the device rises slowly when the N/P ratio is less than 1, and the frequency of the device tends to be stable when the N/P ratio is greater than 1. Therefore, the optimum N/P ratio for achieving the optimal electrical characteristics of the transistor can be determined to be 1 from the electrical characteristic curve.

After the optimal N/P ratio has been obtained, the step of identifying step 4 above may further include determining whether the N/P ratio of the wafer to be tested conforms to the optimal N/P ratio based on the N/P ratio model of the wafer to be tested, and it can be judged from another perspective whether the wafer to be tested is compliant.

In some embodiments, the wafer to be tested is compliant by comparing whether the difference between the N/P ratio to be tested and the N/P optimal coefficient is less than a preset threshold. It can be understood that the above difference can be determined by calculating the difference, calculating the ratio, and the like. And the corresponding preset threshold value may be determined as needed according to the actual situation of the difference, and is not limited herein.

With above in mind, the analysis method provided by the present disclosure has been described for the process of quickly and accurately screening problematic non-compliant wafers from a plurality of wafers. Therefore, it is possible to further research the relevant parameters of the non-compliant wafer, thereby providing possibilities of optimizing the process parameters, and improving the efficiency of providing such possibility.

Further, after the non-compliant wafer has been screened out, the process parameters for manufacturing the non-compliant wafer to be tested are obtained, and analyzed based on an expert system, and the process parameters can further be optimized based on the result of the expert system analysis.

The expert system is an intelligent computer program system, which contains a large number of expert level knowledge and experience in a certain field, and can use the knowledge and problem solving methods of human experts to deal with the problems in the field. In other words, the expert system is a program system with a large amount of expertise and experience. It uses artificial intelligence technology and computer technology to conduct reasoning and judgment based on the knowledge and experience provided by one or more experts in a certain field to simulate the decision-making process of human experts to solve complex problems that require human experts to deal with. In short, the expert system is a computer program system that simulates human experts to solve problems.

The expert system usually consists of six parts: interaction interface, knowledge base, inference engine, interpreter, comprehensive database, and knowledge acquisition. The knowledge base is used to store the knowledge provided by experts. The problem-solving process of the expert system is to simulate the expert's way of thinking through the knowledge in the knowledge base. In the present disclosure, the above-mentioned knowledge database is pre-set with a plurality of association rules of electrical parameters and key process parameters, and is updated by self-learning of the association rules.

After the non-compliant wafer has been screened out, the online process parameters of the HKMG fin field effect transistor fabricated on the non-compliant wafer can be first defined based on the expert system, and the structural size distributions of the HKMG fin field effect transistor corresponding to the on-line process parameters can be obtained.

The online process parameters are based on online testing, which is the opposite of offline testing. The wafer in which the semiconductor device is located is tested offline after the manufacturing is completed. After the test, the wafer does not return to the process line to continue the next manufacturing process. After the online test, the wafer needs to continue to the next site for manufacturing. By performing an online test, the structural size distributions of the HKMG fin field effect transistor corresponding to the online process parameters, that is, the specific values corresponding to the online process parameters can be obtained. Moreover, since it is an online test, it can correct errors in time when the process is found to be mutated, thereby avoiding economic losses.

Specifically, in the prior art, the manufacturing process of the fin field effect transistor can be generally divided into at least the following eight steps:
1、Fin formation
2、Dummy gate formation
3、S/D implantation
4、S/D EPI growth
5、Gate replacement
6、Hi-K Metal Gate formation
7、S/D Contact formation
8、BEOL Correspondingly, the process parameters selected in the process step may specifically include at least:

| | | |
|---|---|---|
| 1, | Top-Fin Width | a |
| 2, | Bottom-Fin Width | b |
| 3, | Fin Height | c |
| 4, | Top-Fin Corner Angle | θ |
| 5, | Gate length | d |
| 6, | Gate-Spacer-1 Thickness | e1 |
| 7, | Gate-Spacer-2 Thickness | e2 |
| 8, | S/D Proximity | f |
| 9, | S/D Depth | g |
| 10, | S/D Epi-Overgrowth Height | h |
| 11, | Lateral S/D SEG Wight | i |
| 12, | HK/IL Thickness | j |
| 13, | Gate Height | k |

The parameters 1-4 correspond to the Fin formation step. Parameters 5-7 correspond to the steps of forming a dummy gate, S/D implantation, S/D EPI growth, and the gate replacement. Parameters 8-11 correspond to the steps of S/D implantation and S/D EPI growth. Parameters 12-13 correspond to the step of forming a high-k metal gate.

The method further includes obtaining a specific value of the electrical parameter obtained after the WAT (Wafer Acceptance Test). As previously mentioned, the above electrical parameters associate with the electrical characteristics of the device such as the turn-on voltage, the puncture voltage, the saturation current, the quiescent current, the turn-off current and the like. After the WAT test, specific values of the device-related electrical characteristic parameters can be obtained.

After acquiring and collecting relevant data, the analysis methods of the expert system include:

Since the transistor has multiple electrical parameters, performing electrical parameter inline analysis on the plurality of electrical parameters, and the electrical parameter inline analysis comprises: constructing a plurality of electrical parameter models by grouping the plurality of electrical parameters in pairs; performing sensitivity analysis on each of the electrical parameter models; extracting a plurality of key electrical parameter models from the plurality of electrical parameter models based on sensitivity analysis results of the electrical parameter models; and performing data mining on the plurality of key electrical parameter models to determine correlations among a plurality of key electrical parameters of the plurality of electrical parameters described above.

And, for the process parameters, there are also inline relationships between the plurality of process parameters, and the analysis method provided by the present disclosure further includes: constructing a plurality of process parameter models by grouping the plurality of process parameters in pairs; performing sensitivity analysis on each of the process parameter models; extracting a plurality of key process parameter models from the plurality of process parameter models based on the results of the sensitivity analysis; and performing data mining on the plurality of key process parameter models to determine correlations among a plurality of key process parameters of the plurality of process parameters described above.

For each electrical parameter, an electrical-process model is established between the electrical parameter and a plurality of process parameters. Sensitivity analysis is performed on each of the above electrical-process models; a plurality of key process parameters are determined from the plurality of process parameters based on the obtained sensitivity analysis results of the electrical-process model; and the relationship between the above electrical parameters and the above plurality of key process parameters is determined based on the knowledge database of the expert system.

The sensitivity analysis described above further includes: calculating a covariance of the corresponding model, and calculating a correlation coefficient of the corresponding model based on the covariance.

Taking the process parameter model as an example, the covariance of each process parameter model can be calculated by the following formula:

$$\text{cov}(IL_1, IL_2) = \sigma_{IL_1 IL_2} = E[(IL_1 - u_1)(IL_2 - u_2)]$$

In one embodiment, E represents the expected value; u1, u2 are the mean values of IL1 and IL2, respectively.

Covariance is used in probability theory and statistics to measure the overall error of two variables. The covariance represents the total error of two variables, which is different from the variance that only represents the error of one variable. If the two variables change in the same trend, that is, if one of them is greater than its own expected value and the other is greater than its own expected value, the covariance between the two variables is a positive value. If the two variables change in opposite directions, that is, one is greater than its own expected value and the other is less than its own expected value, the covariance between the two variables is a negative value.

Intuitively, the covariance represents the expectation of the overall error of the two variables. If the trends of the two variables are the same, that is, if one of them is greater than its own expectation and the other is greater than its own expectation, then the covariance between the two variables is positive; if the two variables change in the opposite direction, that is, if one of the variables is greater than its own expected value and the other is less than its own expected value, the covariance between the two variables is a negative value.

Further, still taking the process parameter model as an example, the correlation coefficient of the corresponding model based on the covariance calculation can be calculated by the following formula:

$$\text{corr}(IL_1, IL_2) = \rho_{IL_1 IL_2} = \frac{\text{cov}(IL_1, IL_2)}{\sqrt{\text{cov}(IL_1)\text{cov}(IL_2)}}$$

and:

$$\text{cov}(IL_1) = \text{cov}(IL_1, IL_1) = \sigma_{IL_1 IL_1} = E[(IL_1 - u_1)(IL_1 - u_1)]$$

$$\text{cov}(IL_2) = \text{cov}(IL_2, IL_2) = \sigma_{IL_2 IL_2} = E[(IL_2 - u_2)(IL_2 - u_2)]$$

And E represents the expected value; u1, u2 are the mean values of IL1 and IL2, respectively.

The correlation coefficient is a statistical indicator used to reflect the closeness of the correlation between variables. Due to the different research objects, the correlation coefficient has many definitions. The Pearson correlation coefficient is more commonly used. The embodiments provided by the present disclosure are also based on the Pearson correlation coefficient. The Pearson correlation coefficient is the first statistical indicator designed by the statistician Carl Pearson. It is the amount of linear correlation between the variables. The Pearson correlation coefficient is calculated by the product-moment method. Based on the dispersion of the two variables and their respective averages, the two dispersions are multiplied to reflect the correlation between the two variables, and the linear single correlation coefficient is studied.

It can be seen from the above calculation method that the Pearson correlation coefficient between IL1 and IL2 is the covariance of IL1 and IL2 divided by the standard deviation of IL1 and the standard deviation of IL2.

Therefore, the correlation coefficient can also be regarded as a covariance which is a special covariance that eliminates the influence of two variables and has been standardized. Because of being a special covariance, the Pearson correlation coefficient has the following characteristics:

1. It can reflect whether the two variables change in the same direction or in the opposite direction. Positive represents the change is in the same direction, negative represents the change is in the opposite direction.

2. Because it is the covariance after standardization, more importantly, it eliminates the influence of the magnitude of the change of the two variables, but simply reflects the degree of similarity between the two variables per unit change.

In general, when the correlation coefficient of IL1 and IL2 is 1, it shows that the positive similarity of the two variables is the largest, that is, IL1 is doubled and IL2 is doubled, or IL1 is halved and IL2 is halved. That is, it is completely positive correlation (with IL1 and IL2 as the horizontal and vertical axes, a straight line with a positive slope can be drawn, so IL1 and IL2 are linear).

As their correlation coefficient decreases, the similarity between the changings of the two variables decreases. When the correlation coefficient is 0, there is no similarity between the changings of the two variables, that is, the two variables are irrelevant.

When the correlation coefficient continues to decrease, to be less than 0, the two variables begin to have a reverse similarity. As the correlation coefficient continues to decrease, the reverse similarity will gradually become larger.

When the correlation coefficient is −1, the reverse similarity of the two variables is the largest, that is, IL1 is doubled and IL2 is halved, or IL1 is halved and IL2 is doubled. That is, it is completely negatively correlated (using IL1 and IL2 as the horizontal and vertical axes, a straight line with a negative slope can be drawn, so IL1 and IL2 are also linear).

That is to say, the larger the absolute value of the Pearson correlation coefficient (the closer to 1 or −1) is, the stronger the correlation is. Conversely, the closer to 0 the Pearson correlation coefficient is, the weaker the correlation is.

After performing the sensitivity analysis, the key parameters or the key parameter models may be extracted according to the relevant rules. Further, the key parameters or the key parameter models are extracted according to whether the absolute value of the correlation coefficient of the corresponding model is greater than a preset threshold. In some embodiments, through the above analysis, the Pearson correlation coefficient between the two variables is in the range of −1 to 1 interval. Therefore, after taking the absolute value, the preset threshold is in the range of 0 to 1, A preset value may be set according to the actual test requirements in the range of 0 to 1, so that the key parameter or the key parameter model may be extracted according to the preset threshold, which is not limited by the present disclosure.

According to one aspect of the analysis method, after extracting the key parameter models, data mining can be performed based on the correlation coefficient matrix of the key parameter models to obtain the correlation between the parameters and the parameters, thereby finding the source parameters. Still take the process parameter model as an example. The establishment of the correlation coefficient matrix can be as follows. The correlation coefficient matrix is constructed by using the correlation coefficients of the key process parameter models as the matrix elements:

$$\rho_{IL} = \begin{bmatrix} \text{corr}(IL_1, IL_1) & \text{corr}(IL_1, IL_2) & \cdots & \text{corr}(IL_1, IL_{n-1}) & \text{corr}(IL_1, IL_n) \\ \text{corr}(IL_2, IL_1) & \text{corr}(IL_2, IL_2) & \cdots & \text{corr}(IL_2, IL_{n-1}) & \text{corr}(IL_2, IL_n) \\ \cdots & \cdots & \cdots & \cdots & \cdots \\ \text{corr}(IL_{n-1}, IL_1) & \text{corr}(IL_{n-1}, IL_2) & & \text{corr}(IL_{n-1}, IL_{n-1}) & \text{corr}(IL_{n-1}, IL_n) \\ \text{corr}(IL_n, IL_1) & \text{corr}(IL_n, IL_2) & & \text{corr}(IL_n, IL_{n-1}) & \text{corr}(IL_n, IL_n) \end{bmatrix}.$$

Subsequently, Agglomerative Hierarchical Clustering (AHC) is performed based on the correlation coefficient matrix, that is, data mining is performed to determine the correlation between key process parameters.

Taking key process parameters as an example, further, although a number of key process parameters have been obtained based on the correlation coefficients, it is found from practice that a large number of key process parameters still exist. And each key process parameter may interact with each other. To extract the hidden correlation between complex and large online process parameters, data mining (DM) techniques are applied to highlight and group related online process parameters. According to data mining, the source of online process parameter changes, that is, the source process parameters, can be revealed.

Specifically, agglomerative hierarchical clustering is a bottom-up hierarchical clustering method that calculates the distance between classes based on a specified similarity or distance definition. The agglomerative hierarchical clustering method first treats each sample point as a single cluster, and then merges two clusters with the closest "distance" at each step (the distance here can be regarded as the definition of cluster proximity) until all the clusters are classified into the same class. Hierarchical clustering is often represented by a dendrogram (using "single-chain" clustering), from which the relationship between the cluster and its sub-clusters, and the order in which the clusters are merged and split are visible. For 2D sample points, it can also be represented by a similar Nested Cluster Diagram.

Specifically, the basic agglomerative hierarchical clustering is the basis of the clustering hierarchical clustering algorithm family. The main idea is to start from the individual points as clusters and merge the two clusters with the closest "distance" until only one cluster remains. As follows:

Calculate the proximity matrix if needed;
Repeat:
Merge the two closest clusters;
Updating the proximity matrix to reflect the proximity between the new cluster and the original cluster;
until: Only one cluster remains.

In the embodiment provided by the present disclosure, the proximity matrix may be the correlation coefficient matrix established above. Data mining based on agglomerative hierarchical clustering can group key process parameters and determine source process parameters.

According to the determined source process parameters, the subsequent plurality of parameters can be optimized by adjusting the source process parameters, so that the HKMG fin field effect transistor has better characteristics.

According to another aspect of the analysis method, after the key process parameter model has been extracted, the relationship between the above-mentioned key process parameters and the electrical characteristics of the transistors is further explored based on the knowledge database using the expert system. It is intended to determine the correlation and empirical formula between key process parameters and electrical characteristics.

The knowledge base is used to store the knowledge provided by experts. The problem-solving process of the expert system is to simulate the expert's way of thinking through the knowledge in the knowledge base. In the present disclosure, the above-mentioned knowledge database is preset with a plurality of association rules of electrical parameters and key process parameters, and is updated by self-learning of the association rules.

Therefore, with the help of the expert system and its knowledge database, the correlation and empirical formula between the electrical parameters and the key process parameters can be obtained, which provides the possibility to adjust the key process parameters to obtain better device performance.

Moreover, since a plurality of key electrical parameters and their correlations, each key electrical parameter and its corresponding multiple key process parameters, and the association among the multiple key process parameters can be obtained, the relationship between multiple key electrical parameters and multiple key process parameters can be determined by means of a knowledge database based on the expert system according to a plurality of key electrical parameters and their correlations, each key electrical parameter and its corresponding multiple key process parameters, and the association among the multiple key process parameters.

Therefore, according to the analysis method provided by the present disclosure, the problematic non-compliant wafer can be found from a plurality of wafers through the N/P ratio model, and the process parameters for manufacturing the non-compliant wafer can be obtained, and then some key process parameters that affect the electrical characteristics can be found out according to the electrical-process parameter model, and then the source process parameters can be found out according to the mutual influence relationship of the process parameters, and how the electrical parameters interact with the source process parameters can be determined according to the formula between electrical parameters and source process parameters (or other key process parameters) based on experience. Therefore, the source process parameters are adjusted to effectively make the non-compliant parameters meet the actual needs.

With above in mind, if the saturation current of the FinFET is found to be unsatisfactory by the N/P ratio model, the source of the process parameters adjustment can be found according to the needs and the empirical formula obtained by the analysis method provided by the present disclosure. That is can choose to adjust the fin height, top fin width, bottom fin width, etc. to accurately and efficiently optimize the saturation current in the desired direction.

The analysis method proposed by the disclosure is used to investigate the influence of the process variation parameters of the 16 nm HKMG fin field effect transistor on the electrical properties of the device, and at the same time find the true source of the process variation and model the electrical characteristics. Since there are too many process variation parameters in the advanced process, the analysis method provided by the present disclosure emphasizes that the N/P ratio is first used to find a conforming model, and then the failure mode is efficiently found by identification. Sensitivity analysis is then used to screen out important process variation parameters. However, the selected process variation parameters may be affected by the interaction between different processes. According to data mining, the hidden correlation between complex and a large number of online process parameters is extracted, and data mining technology is applied to highlight and group related online process parameters, which explain the source of changes in the online process parameters in each group, thus providing the possibility to subsequently optimize the online process parameters.

The present disclosure also provides a computer device comprising a memory, a processor, and a computer program stored on the memory and operable on the processor, the processor executing the computer program to implement the steps of the above method.

The present disclosure also provides a computer readable storage medium having stored there on a computer program that, when executed by a processor, implements the steps of the above method.

Embodiments of the computer device and the computer readable storage medium can be understood by referring to the embodiments of the semiconductor device analysis method described above, and details are not described herein again.

In some embodiments, various illustrative logic blocks, modules, circuits, and algorithm steps described in conjunction with the embodiments disclosed herein can be implemented as electronic hardware, computer software, or a combination of both. In order to illustrate the interchangeability between hardware and software, various illustrative components, frames, modules, circuits, and steps are generally described above in the form of functionalities thereof. Whether such functionalities are implemented as hardware or software is dependent on a specific application and design constrains imposed on the entire system. In some embodiments, the described functionalities in different manners for each particular application, but this implementation decision should not be construed as resulting in departing from the scope of the present disclosure.

The various illustrative logic modules, and circuits described in connection with the embodiments disclosed herein may be general purpose processors, digital signal processors (DSPs), application specific integrated circuits (ASICs), field programmable gate arrays (FPGAs), or other programmable logic devices, discrete gate or transistor logic, discrete hardware components, or any combination thereof designed to perform the functions described herein are implemented or executed. A general purpose processor may be a microprocessor, but in the alternative, the processor may be any conventional processor, controller, microcontroller, or state machine. The processor may also be implemented as a combination of computing devices, such as a combination of a DSP and a microprocessor, a plurality of microprocessors, one or more microprocessors in conjunction with a DSP core, or any other such configuration.

The steps of a method or algorithm described in connection with the embodiments disclosed herein may be embodied in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor to enable the processor to read and write information to/from the storage medium. In the alternative, the storage medium can be integrated into the processor. The processor and the storage medium can reside in an ASIC. The ASIC can reside in the user terminal. In the alternative, the processor and the storage medium may reside as a discrete component in the user terminal.

In one or more exemplary embodiments, the described functions can be implemented in hardware, software, firmware or their any combination. If they are implemented as a computer program product in software, then various functions can be stored in a computer readable medium as one or more instructions or codes or transported via same. The computer readable medium comprises both a computer storage medium and a communication medium, and comprises any medium facilitating a computer program to transfer from one place to another. The storage medium can be any available medium that can be accessed by a computer. As an example but not limitation, such a computer readable medium can comprise RAM, ROM, EEPROM, CD-ROM or other optical disk storages, magnetic disk storages or other magnetic storage device, or any other medium that can be used for carrying or storing appropriate program codes in the form of instructions or data structures and can be accessed by a computer. Any connection is also rightly called a computer readable medium. For example, if the software is transported from a web site, a server, or other remote sources using a coaxial-cable, an optical fibre cable, a twisted pair, a digital subscriber line (DSL), or wireless techniques such as infrared, radio, and microwave or anything like that, then the coaxial-cable, the optical fibre cable, the twisted pair, the DSL, or the wireless techniques such as infrared, radio, microwave or anything like that are included in the definition of medium. Disks and discs as used herein comprise a compact disc (CD), a laser disc, an optical disc, a digital versatile disc (DVD), a floppy disk and a blue-ray disc, and the disks often reproduce data magnetically, and the discs optically reproduce data with laser. Combinations of the forgoing should also be included in the range of the computer readable medium.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. An analysis method of a semiconductor device, wherein the semiconductor device comprises a plurality of HKMG fin field effect transistors and a wafer on which the plurality of HKMG fin field effect transistors are located, wherein the analysis method comprises:
    performing acceptance testing on the wafer to be tested and obtaining a wafer surface position distribution, the wafer surface position distribution being associated with electrical parameters obtained from the acceptance testing;
    constructing an N-type model based on positioning of each N-type transistor at a surface of the wafer to be tested and a corresponding acceptance test result, constructing a P-type model based on positioning of each P-type transistor at the surface of the wafer to be tested and the corresponding acceptance test result, and constructing an N/P ratio model corresponding to the surface of the wafer to be tested based on the N-type model and the P-type model, the N/P ratio model being associated with the wafer surface position distribution; and
    comparing the N/P ratio model with a standard N/P ratio model of a preset standard wafer model to determine whether the wafer to be tested is compliant based on a similarity between the standard N/P ratio model and the N/P ratio model, the standard N/P ratio model being associated with a standard wafer surface position distribution.

2. The analysis method according to claim 1, wherein the analysis method further comprises:
    performing clustering processing on the N/P ratio model, and a clustered N/P ratio model displays a distribution of N/P ratio groups on the surface of the wafer to be tested;
    the identifying further includes: comparing a similarity between a standard wafer model and the clustered N/P ratio model; wherein the standard wafer model shows a distribution of optimal N/P ratio groups on a wafer surface; and
    in response to the similarity being lower than a preset threshold, the wafer to be tested corresponding to the N/P ratio model is not compliant.

3. The analysis method according to claim 2, wherein the N/P ratio model is clustered by a k-means clustering method.

4. The analysis method according to claim 1, wherein the analysis method further comprises:
    obtaining an acceptance test result of a transistor corresponding to a standard wafer model;
    calculating a ratio of an acceptance test result of an N-type transistor corresponding to the standard wafer model to an acceptance test result of a P-type transistor as an N/P standard coefficient;
    constructing an electrical characteristic curve of the transistor corresponding to the standard wafer model based on the acceptance test result of the transistor corresponding to the standard wafer model and the N/P standard coefficient, and
    determining an N/P optimum coefficient based on the electrical characteristic curve.

5. The analysis method according to claim 4, wherein the constructing the N/P ratio model further comprises: corresponding to the surface of the wafer to be tested, calculating the ratio of an acceptance test result of the N-type transistor and an acceptance test result of P-type transistor as an N/P test coefficient; and
    the analyzing method further includes: comparing whether a difference between the N/P test coefficient and the N/P optimal coefficient is less than a preset threshold to determine whether the wafer to be tested is compliant.

6. The analysis method according to claim 1, wherein the acceptance test comprises at least: testing one or more of a turn-on voltage, a puncture voltage, a saturation current, a quiescent current, a turn-off current, a frequency of an N-type semiconductor, a P-type semiconductor.

7. The analysis method according to claim 1, wherein the analyzing method further comprises: for the wafer to be tested that is determined to be non-compliant, obtaining process parameters for manufacturing a non-compliant wafer to be tested; and
    analyzing the process parameters based on an expert system.

8. The analysis method according to claim 7, wherein the analysis method further comprises: optimizing the process parameters based on an analyzed result.

9. A computer apparatus comprising:
    a memory configured to store a first data unit, the first data unit including an acceptance test result of a transistor corresponding to a standard wafer model;
    a processor configured to access the memory and process the first data unit; and
    a computer program stored on the memory and operable on the processor,
    wherein the processor executes the computer program to perform a sequence of operations comprising:
        calculating a ratio of an acceptance test result of an N-type transistor corresponding to the standard wafer model to an acceptance test result of a P-type transistor as an N/P standard coefficient;
        constructing an electrical characteristic curve of the transistor corresponding to the standard wafer model based on the acceptance test result of the transistor corresponding to the standard wafer model and the N/P standard coefficient; and determining an N/P optimum coefficient based on the electrical characteristic curve.

10. An analysis method of a semiconductor device, wherein the semiconductor device comprises a plurality of HKMG fin field effect transistors and a wafer on which the plurality of HKMG fin field effect transistors are located, wherein the analysis method comprises:

performing acceptance testing on the wafer to be tested;

constructing an N-type model based on positioning of each N-type transistor at a surface of the wafer to be tested and a corresponding acceptance test result, constructing a P-type model based on positioning of each P-type transistor at the surface of the wafer to be tested and the corresponding acceptance test result, and constructing an N/P ratio model corresponding to the surface of the wafer to be tested based on the N-type model and the P-type model;

performing clustering processing on the N/P ratio model, and a clustered N/P ratio model displays a distribution of N/P ratio groups on the surface of the wafer to be tested; and comparing a similarity between a standard wafer model and the clustered N/P ratio model to determine whether the wafer to be tested is compliant;

wherein the standard wafer model shows a distribution of optimal N/P ratio groups on a wafer surface;

wherein in response to the similarity being lower than a preset threshold, the wafer to be tested corresponding to the N/P ratio model is not compliant.

11. The analysis method according to claim 10, wherein the N/P ratio model is clustered by a k-means clustering method.

12. The analysis method according to claim 10, wherein the acceptance testing comprises at least: testing one or more of a turn-on voltage, a puncture voltage, a saturation current, a quiescent current, a turn-off current, a frequency of an N-type semiconductor, a P-type semiconductor.

\* \* \* \* \*